(12) United States Patent
Shah et al.

(10) Patent No.: US 11,515,191 B2
(45) Date of Patent: Nov. 29, 2022

(54) GRADED DIMPLE HEIGHT PATTERN ON HEATER FOR LOWER BACKSIDE DAMAGE AND LOW CHUCKING VOLTAGE

(71) Applicant: Applied Materials, Inc., Santa Clara, CA (US)

(72) Inventors: Vivek B. Shah, Sunnyvale, CA (US); Bhaskar Kumar, San Jose, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 442 days.

(21) Appl. No.: 16/598,665

(22) Filed: Oct. 10, 2019

(65) Prior Publication Data

US 2020/0135530 A1 Apr. 30, 2020

Related U.S. Application Data

(60) Provisional application No. 62/751,425, filed on Oct. 26, 2018.

(51) Int. Cl.
*H01L 21/683* (2006.01)
*H05B 1/02* (2006.01)
*H01L 21/67* (2006.01)

(52) U.S. Cl.
CPC .... *H01L 21/6833* (2013.01); *H01L 21/67288* (2013.01); *H05B 1/0233* (2013.01)

(58) Field of Classification Search
CPC .......... H01L 21/6833; H01L 21/67288; H01L 21/6831; H01L 21/6875; H01L 21/68757;
(Continued)

(56) References Cited

U.S. PATENT DOCUMENTS

| 7,718,007 B2 | 5/2010 | Oohashi et al. |
| 2003/0002973 A1* | 1/2003 | Kostler ................... G03F 7/707 414/754 |

(Continued)

FOREIGN PATENT DOCUMENTS

| JP | 2000-031253 | 1/2000 |
| KR | 10-2003-0063448 | 7/2003 |

OTHER PUBLICATIONS

International Search Report and Written Opinion from PCT/US2019/057288 dated Feb. 11, 2020, 9 pgs.
(Continued)

*Primary Examiner* — Dharti H Patel
(74) *Attorney, Agent, or Firm* — Schwabe, Williamson & Wyatt, P.C.

(57) ABSTRACT

Embodiments disclosed herein may include a heater pedestal. In an embodiment, the heater pedestal may comprise a heater pedestal body and a conductive mesh embedded in the heater pedestal. In an embodiment, the conductive mesh is electrically coupled to a voltage source In an embodiment, the heater pedestal may further comprise a support surface on the heater pedestal body. In an embodiment, the support surface comprises a plurality of pillars extending out from the heater pedestal body and arranged in concentric rings. In an embodiment pillars in an outermost concentric ring have a height that is greater than a height of pillars in an innermost concentric ring.

17 Claims, 6 Drawing Sheets

(58) Field of Classification Search
CPC ............ H01L 21/68735; H05B 1/0233; H05B 2203/014; H05B 3/283
USPC ........................................................ 361/234
See application file for complete search history.

(56) References Cited

U.S. PATENT DOCUMENTS

2014/0017903 A1* 1/2014 Bello .................... H01L 21/304
  438/758
2014/0355169 A1 12/2014 Maeta et al.
2019/0333764 A1* 10/2019 Chan ....................... C23C 16/26

OTHER PUBLICATIONS

International Preliminary Report on Patentability from PCT/US2019/057288 dated May 6, 2021, 6 pgs.

* cited by examiner

GRADED DIMPLE HEIGHT PATTERN ON HEATER FOR LOWER BACKSIDE DAMAGE AND LOW CHUCKING VOLTAGE

CROSS REFERENCE TO RELATED APPLICATIONS

This application claims priority to U.S. Provisional Application No. 62/751,425, filed on Oct. 26, 2018, the entire contents of which are hereby incorporated by reference herein.

BACKGROUND

1) Field

Embodiments relate to the field of semiconductor manufacturing and, in particular, to electrostatic chucks with non-planar support surfaces to enable lower chucking voltages for warped substrates.

2) Description of Related Art

Heaters are used at many different times during the processing of substrates, such as semiconducting wafers. In order to provide uniform heating, the semiconductor wafers are chucked (e.g., electrostatic chucking) to a surface of the heater. However, throughout the processing of substrates, internal stains develop that may result in bowing of the substrates. For example, in FIG. 1 a cross-sectional illustration of a tool 100 with a heater pedestal 105 is shown. As shown, the heater pedestal has a support surface 107 on which a substrate 120 rests. Due to warping, the substrate 120 has a bottom surface 121 that extends up from the support surface 107. At the edges of the substrate 120, the bottom surface 121 may be raised up from the support surface 107 by a distance Δ. In some instances, the distance Δ may be 300 μm or greater.

In order to accommodate such large deformations, the chucking force of the heater pedestal 105 needs to be large. For example, chucking voltages of 600V or higher may be needed. In addition to the large energy consumption, such large chucking voltages may result in backside damage to the substrate.

SUMMARY

Embodiments disclosed herein include an electrostatic chuck. In an embodiment, the electrostatic chuck may comprise a chuck body, and a support surface on the chuck body for supporting a substrate. In an embodiment, the support surface is non-planar.

Additional embodiments disclosed herein may include a semiconductor manufacturing tool. In an embodiment, the semiconductor manufacturing tool comprises a heater pedestal and a conductive mesh embedded in the heater pedestal. In an embodiment, the conductive mesh is electrically coupled to a voltage source. In an embodiment, the semiconductor manufacturing tool may further comprise a support surface on the heater pedestal. In an embodiment the support surface is non-planar.

Additional embodiments disclosed herein may include a heater pedestal. In an embodiment, the heater pedestal may comprise a heater pedestal body and a conductive mesh embedded in the heater pedestal body. In an embodiment, the conductive mesh is electrically coupled to a voltage source In an embodiment, the heater pedestal may further comprise a support surface on the heater pedestal body. In an embodiment, the support surface comprises a plurality of pillars extending out from the heater pedestal body and arranged in concentric rings. In an embodiment pillars in an outermost concentric ring have a height that is greater than a height of pillars in an innermost concentric ring.

DETAILED DESCRIPTION

Systems that include an electrostatic chuck with a surface for accommodating warped substrates in order to decrease the chucking voltage are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, currently available heater pedestals are only able to accommodate warped substrates by using exceedingly high chucking voltages. Such solutions result in wasted energy and the possibility of damaging the substrate.

Furthermore, as substrates continue to scale to larger sizes, the warpage will increase in severity. Accordingly, embodiments disclosed herein include electrostatic chucks with a non-planar support surface. The use of a non-planar support surface allows for the incoming warped substrate to be at least partially accommodated to reduce the maximum gap between the substrate and the support surface. Accordingly, the chucking voltage needed to secure the substrate to the electrostatic chuck may be reduced.

Figure 1:
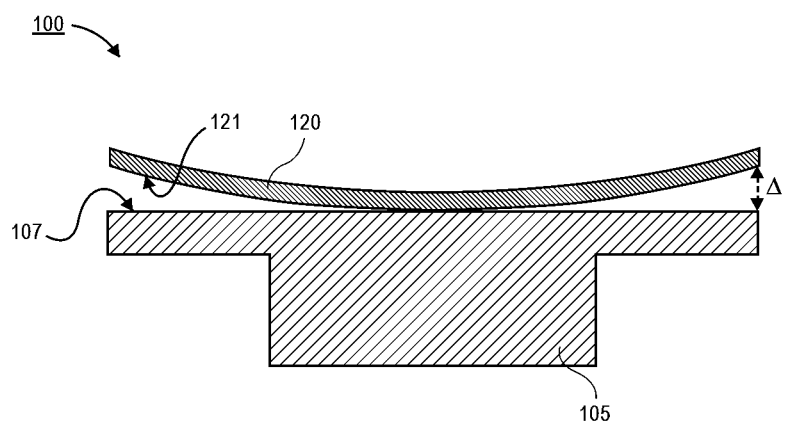
FIG. 1 is a cross-sectional illustration of an electrostatic chuck with a warped substrate resting on a surface of the electrostatic chuck.
Figure 2A:
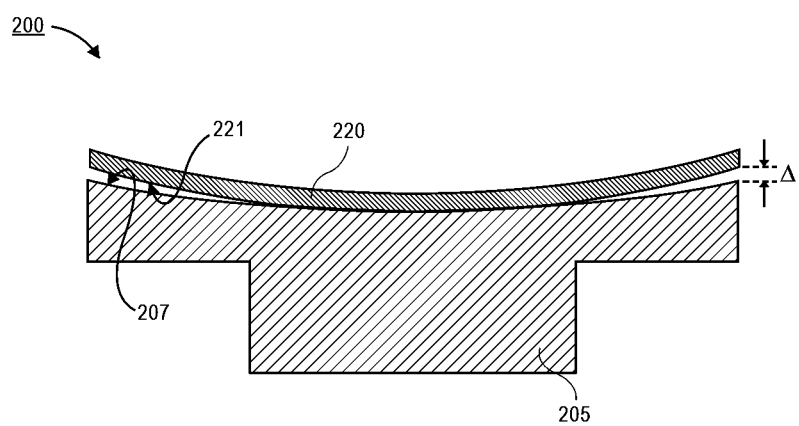
FIG. 2A is a cross-sectional illustration of an electrostatic chuck with a non-planar surface to accommodate a warped substrate, in accordance with an embodiment.

Referring now to FIG. 2A, a cross-sectional illustration of a tool 200 with an electrostatic chuck 205 with a non-planar support surface 207 is shown, in accordance with an embodiment. In an embodiment, the electrostatic chuck 205 may be any suitable electrostatic chuck on which substrates 220 are mounted. In a particular embodiment, the electrostatic chuck 205 may be a heater pedestal. For example, the electrostatic chuck 205 may include heating elements (not shown) for controlling a temperature of the substrate 220. In an embodiment, the substrate 220 may be a wafer (e.g., a silicon wafer or the like). In an embodiment, the electrostatic chuck 205 may be sized to accommodate any sized substrate 220 (e.g., 300 mm, 450 mm, or the like).

In an embodiment, the support surface 207 may be non-planar. That is, the support surface 207 may be curved. In an embodiment, the non-planar support surface 207 may be shaped to accommodate a bowed substrate. For example, in the case of a tensile bowed substrate 220, such as the substrate shown in FIG. 2A, the support surface 207 may be bowl shaped. That is, a central portion of the support surface 207 may be below an edge portion of the support surface 207. For example, the difference between the central portion of the support surface 207 and an edge portion of the support surface 207 in the Z-direction may be approximately 300 μm or greater, 200 μm or greater, or 50 μm or greater.

Accordingly, as the bowed substrate 220 rests on the support surface 207, the gap distance Δ between the bottom surface 221 of the substrate 220 and the support surface is reduced. For example, when the incoming substrate 220 has a tensile bow of 300 μm and the non-planar support surface 207 has a bow of 200 μm, the resulting gap distance Δ is reduced from 300 μm to 100 μm. As such, the chucking voltage needed to secure the substrate 220 is reduced. For example, a gap distance Δ of 100 μm may only need 100V, compared to the 600V needed to chuck a substrate with a gap distance Δ of 300 μm.

Figure 2B:
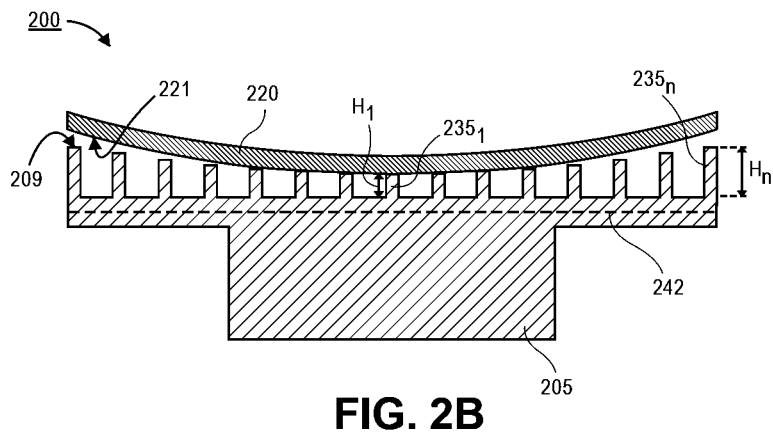
FIG. 2B is a cross-sectional illustration of an electrostatic chuck with a support surface that comprises a plurality of protrusions that have a non-uniform height for accommodating a warped substrate, in accordance with an embodiment.

Referring now to FIG. 2B, a cross-sectional illustration of tool 200 with an electrostatic chuck 205 with a plurality of protrusions 235 is shown, in accordance with an embodiment. In an embodiment, the electrostatic chuck 205 may be substantially similar to the electrostatic chuck 205 described above with respect to FIG. 2A, with the exception that the support surface 209 is comprised of a plurality of protrusions 235. Particularly, the support surface 209 may comprise the top surfaces of each of the protrusions 235. In an embodiment, the electrostatic chuck 205 may include one or more electrodes 242 connected to a voltage source (not shown). In an embodiment, the one or more electrodes 242 may be a conductive mesh embedded in the electrostatic chuck 205. In an embodiment, the electrostatic chuck 205 may be a heater.

In an embodiment, the plurality of protrusions 235 may have a non-uniform height H. For example, the height H of the protrusions 235 may increase with increasing distance from a center of the electrostatic chuck 205. For example, a centermost protrusion $235_1$ may have a first height $H_1$ and an outermost protrusion $235_n$ may have a second height $H_2$ that is greater than the first height. In an embodiment, the protrusions 235 between the centermost protrusion $235_1$ and the outermost protrusion $235_n$ may have continually increasing heights (moving outward from the centermost protrusion $235_1$ to the outermost protrusion $235_n$).

In the illustrated embodiment, fifteen protrusions 235 are shown. However, it is to be appreciated that any number of protrusions 235 may be provided, depending on the needs of the device. In an embodiment, the protrusions 235 may be an integral part of the electrostatic chuck 205. That is, the protrusions 235 may be features machined into the electrostatic chuck 205. In other embodiments, the protrusions 235 may be attached to the electrostatic chuck 205 with some attachment mechanism.

Figure 2C:
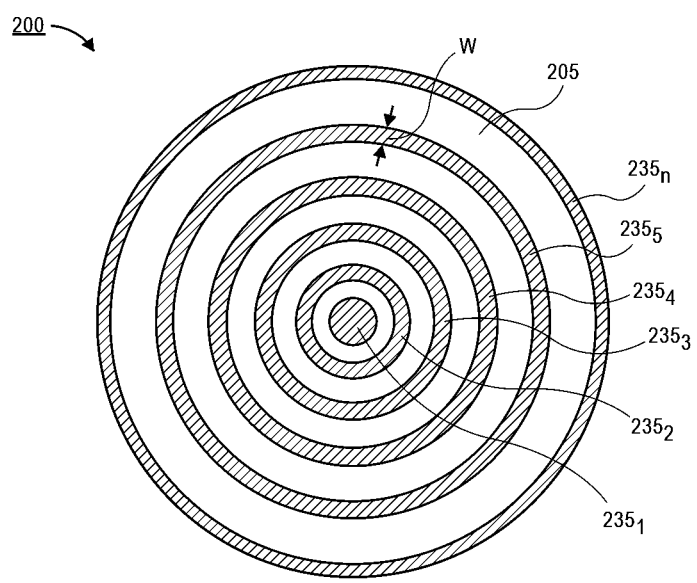
FIG. 2C is a plan view illustration of an electrostatic chuck with a plurality of concentric ring protrusions, in accordance with an embodiment.

Referring now to FIG. 2C, a plan view illustration of the electrostatic chuck 205 is shown, in accordance with an embodiment. As shown, the plurality of protrusions $235_{1-n}$ have a concentric arrangement. In an embodiment, the first protrusion $235_1$ may be at the approximate center of the electrostatic chuck 205. In an embodiment, the first protrusion $235_1$ may be a pillar. For example, the pillar may be cylindrical. In an embodiment, the other protrusions (e.g., protrusions $235_{2-n}$) may be concentric rings around the first protrusion $235_1$. In an embodiment, the concentric ring protrusions $235_{2-n}$ may have a uniform spacing and a uniform ring width W. In other embodiments, the ring protrusions $235_{2-n}$ may have a non-uniform spacing and/or a non-uniform ring width W. In an embodiment, the width W of the ring protrusions 235 may be between 1 mm and 3 mm. In a particular embodiment, the width W of the protrusions may be approximately 2 mm.

While not visible in FIG. 2C, it is to be appreciated that the protrusions $235_{1-n}$ may have non-uniform heights. Similar to what is shown in FIG. 2B, the first protrusion $235_1$ may have a first height and the outermost protrusion $235_n$ may have a second height that is greater than the first height. In an embodiment, the protrusions $235_{1-n}$ may have a height that increases with increasing radial distance from the center of the electrostatic chuck 205. That is, the first protrusion $235_1$ may have the smallest height, the second protrusion $235_2$ may have a height larger than the height of the first protrusion $235_1$, the third protrusion $235_3$ may have a height larger than the height of the second protrusion $235_2$, the fourth protrusion $235_4$ may have a height larger than the height of the third protrusion $235_3$, the fifth protrusion $235_5$ may have a height larger than the height of the fourth protrusion $235_4$, and the nth protrusion $235_n$ may have a height larger than the height of the fifth protrusion $235_5$.

While the protrusions $235_{2-n}$ are shown as concentric rings in FIG. 2C, it is to be appreciated that the protrusions 235 may take any configuration. For example, the protrusions 235 may comprise a plurality of pillars, as shown in FIG. 2D.

Figure 2D:
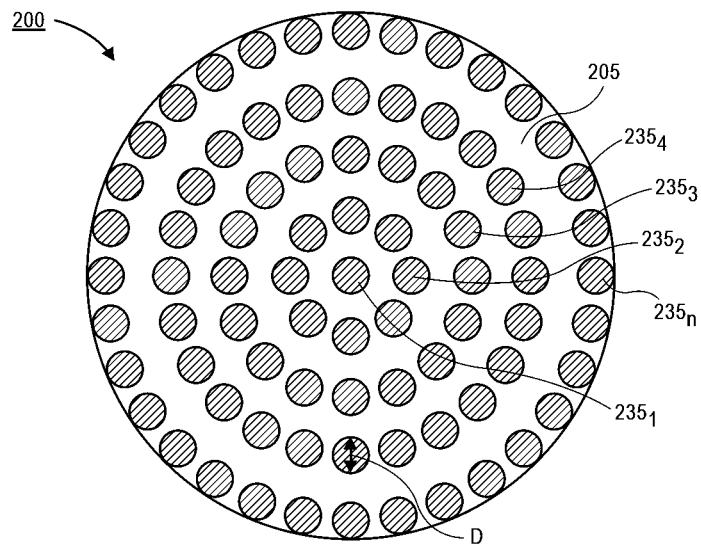
FIG. 2D is a plan view illustration of an electrostatic chuck with a plurality of pillar shaped protrusions in a radial configuration, in accordance with an embodiment.

Referring now to FIG. 2D, a plan view illustration of a tool 200 with an electrostatic chuck 205 with a plurality of pillar protrusions $235_{1-n}$ is shown, in accordance with an embodiment. In an embodiment, the pillar protrusions 235 may be arranged in a radial configuration. That is, a first pillar protrusion $235_1$ may be formed at the center of the electrostatic chuck 205 and successively larger rings (each comprising a plurality of pillar protrusions 235) may be formed around the first pillar protrusion $235_1$. For example, pillar protrusions $235_2$ may be arranged in a ring around the first pillar protrusion $235_1$, pillar protrusions $235_3$ may be arranged in a ring around the pillar protrusions $235_2$, etc. While shown as being arranged in a ring configuration, it is to be appreciated that the pillar protrusions 235 may be arranged in any configuration, so long as the heights of the pillar protrusions 235 have heights that increase as the distance from the center of the electrostatic chuck is increased. In an embodiment, each successively larger ring may comprise pillar protrusions 235 of increasingly taller features. For example, the first pillar protrusion $235_1$ may be the shortest feature and the pillar protrusions $235_n$ may be the tallest features. Accordingly, a support surface for accommodating a tensile warped substrate is provided.

In FIG. 2D, the pillar protrusions 235 are shown as being substantially cylindrical. In an embodiment, the pillar protrusions 235 may have a diameter D that is between 1 mm and 3 mm. In a particular embodiment, the diameter D is approximately 2 mm. In the illustrated embodiment, the pillar protrusions 235 are all shown as having a substantially uniform diameter D. However, in other embodiments, the diameters D of the pillar protrusions 235 may be non-uniform. For example, the diameter of the pillar protrusions 235 may increase the further away from the center of the electrostatic chuck the pillar protrusion 235 is positioned (e.g., pillar protrusion $235_n$ may have a larger diameter D than pillar protrusion $235_1$).

While shown as having substantially cylindrical shapes, it is to be appreciated that the pillar protrusions 235 may have any desired shape. For example, the pillar protrusions 235 may have rectangular prism shapes, or any other three dimensional shape. In an embodiment, all of the pillar protrusions 235 may have the same shape (e.g., all of the pillar protrusions 235 may be cylindrical) or the pillar protrusions 235 may be more than one shape (e.g., a first group of pillar protrusions 235 may be cylindrical and a second group of pillar protrusions 235 may be rectangular prisms).

Figure 2E:
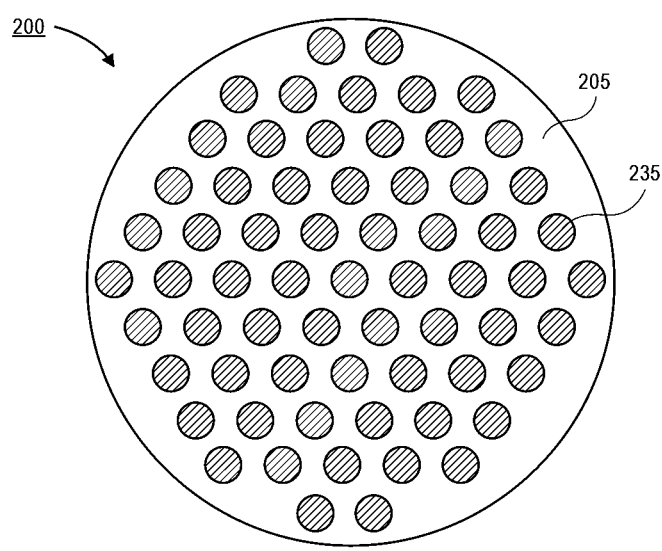
FIG. 2E is a plan view illustration of an electrostatic chuck with a plurality of pillar shaped protrusions in a grid configuration, in accordance with an embodiment.

Referring now to FIG. 2E, a plan view illustration of a tool 200 with an electrostatic chuck 205 is shown, in accordance with an additional embodiment. The electrostatic chuck 205 in FIG. 2E may be substantially similar to the electrostatic chuck 200 in FIG. 2D, with the exception that the pillars 235 are arranged in a grid-like pattern. That is, the embodiment in FIG. 2D may have pillars arranged with a polar coordinate system, and the embodiment in FIG. 2E may have pillars arranged with a Cartesian coordinate system.

Figure 2F:
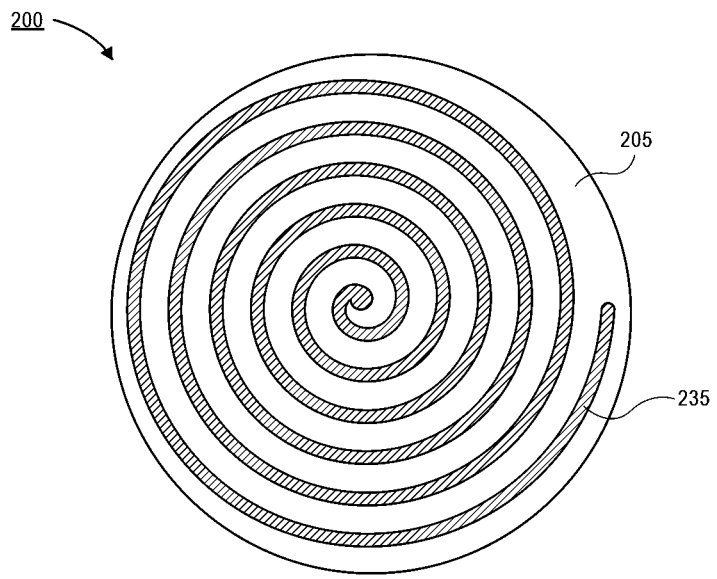
FIG. 2F is a plan view illustration of an electrostatic chuck with a spiral protrusion, in accordance with an embodiment.

Referring now to FIG. 2F, a plan view illustration of a tool 200 with an electrostatic chuck 205 is shown, in accordance with an additional embodiment. In an embodiment, the electrostatic chuck 205 may comprise a protrusion 235 that is a spiral. The spiral protrusion 235 may have a non-uniform height. For example, a beginning of the spiral protrusion 235 (proximate to the center of the electrostatic chuck 235) may have a smaller height than an end of the spiral protrusion 235 (proximate to the edge of the electrostatic chuck 235). In an embodiment, a single spiral protrusion 235 is shown, but it is to be appreciated that some embodiments may include more than one spiral protrusion 235.

The support surfaces described above are particularly beneficial for accommodating a tensile bowed substrate. Particularly, the concave (i.e., bowl shaped) support surface allows for the effective bow (i.e., the gap distance Δ) of a tensile bowed substrate to be reduced. Therefore, the chucking voltage needed to secure the bowed substrate is reduced as well. However, it is to be appreciated that embodiments are not limited to accommodation to tensile bowed substrates only. For example, embodiments may also include a support surface that is suitable for accommodating compressive bowed substrates. Such an embodiment is shown in FIG. 3.

Figure 3:
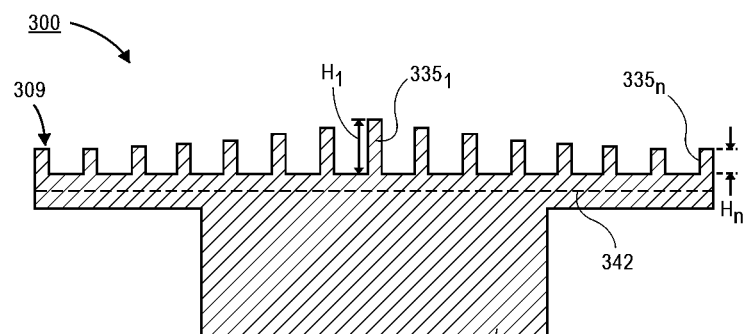
FIG. 3 is a cross-sectional illustration of an electrostatic chuck with a support surface that comprises a plurality of protrusions that have a non-uniform height for accommodating a convexly warped substrate, in accordance with an embodiment.

Referring now to FIG. 3, a cross-sectional illustration of a tool 300 with an electrostatic chuck 305 with a support surface 309 for accommodating a compressive bowed substrate is shown, in accordance with an embodiment. In an embodiment, the electrostatic chuck 305 may be substantially similar to the electrostatic chuck 205 described with respect to FIG. 2A, with the exception that the support surface is inverted to accommodate a substrate warped in the opposite (i.e., convex) direction.

In an embodiment, the support surface 309 may be comprised of a plurality of protrusions $335_{1-n}$. In an embodiment, the protrusions 335 may have a height H that is non-uniform. That is, protrusions 335 have heights H that decrease the further the protrusion 335 is from the center of the electrostatic chuck 305. For example, the centermost protrusions $335_1$ may have a first height $H_1$ and the outermost protrusion $335_n$ may have a second height $H_2$ that is less than the first height $H_1$. In an embodiment, the difference between the first height $H_1$ and the second height $H_2$ may be 200 μm or more, 100 μm or more or 50 μm or more.

In an embodiment, the protrusions 335 may be ring protrusions, similar to what is shown in FIG. 2C. That is, the protrusions 335 may be concentric rings surrounding a pillar protrusion 335 at the center of the electrostatic chuck 305. In such an embodiment, the ring protrusions 335 may have smaller heights as the diameter of the ring increases (i.e., the ring protrusions 335 proximate to the edge of the electrostatic chuck 305 may have a smaller height than a height of ring protrusions 335 proximate to a center of the electrostatic chuck 305).

In an embodiment, the protrusions 335 may be a plurality of pillar protrusions, similar to what is shown in FIG. 2D or FIG. 2E. That is, the protrusions 335 may be substantially cylindrical (or any other shape) pillars that are distributed across the surface of the electrostatic chuck 305. In an embodiment, the pillar protrusions 335 may be arranged in rings around the center of the electrostatic chuck 305. In such an embodiment, the height of the pillar protrusions 335 may decrease the further away from the center of the electrostatic chuck 305 the pillar protrusion 335 is located (i.e., the pillar protrusions 335 proximate to the edge of the electrostatic chuck 305 may have a smaller height than a height of pillar protrusions 335 proximate to a center of the electrostatic chuck 305). In other embodiments, the protrusions 335 may be part of a single spiral protrusion, similar to what is shown in FIG. 2F.

In some embodiments, the use of protrusions may result in large forces being applied between the support surfaces of the protrusions and the backside of the substrate being secured. The small gaps between the protrusions and the substrate results in an increased capacitive coupling at these isolated locations. Due to the large forces, the protrusions may damage the backside of the substrate in some instances. Accordingly, embodiments disclosed herein may further include a charge spreading mechanism to reduce the forces at the support surfaces.

Figure 4A:
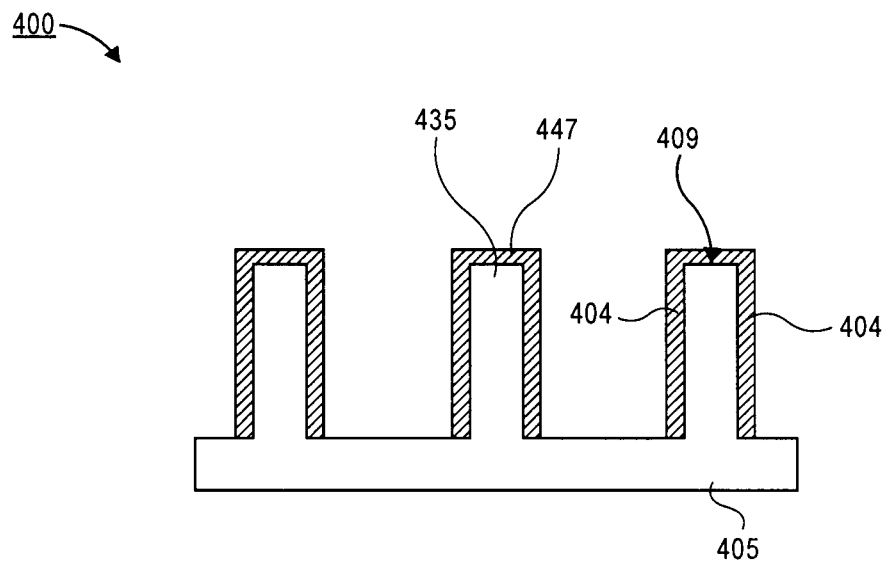
FIG. 4A is a cross-sectional illustration of a portion of an electrostatic chuck, where the protrusions are covered by a conductive layer, in accordance with an embodiment.

An example of such an embodiment is shown in FIG. 4A. FIG. 4A is a cross-sectional illustration of a tool 400 with an electrostatic chuck 405 with a plurality of protrusions 435. In an embodiment, the protrusions 435 may each be coated with a conductive layer 447. As shown, the conductive layer 447 may cover the support surface 409 and sidewall surfaces 404 of the protrusions 435. The conductive layer 447 allows for charge at the support surface 409 to be spread in order to locally reduce the force between the support surface 409 and the substrate. This reduces the possibility of damaging the substrate.

The conductive layers 447 over each of the protrusions 435 may be electrically isolated from each other. For example, the top surface of the electrostatic chuck 405 between each of the protrusions 435 may be exposed (i.e., not covered by a conductive layer). This allows for charge to build and provide electrostatic coupling to the substrate.

Figure 4B:
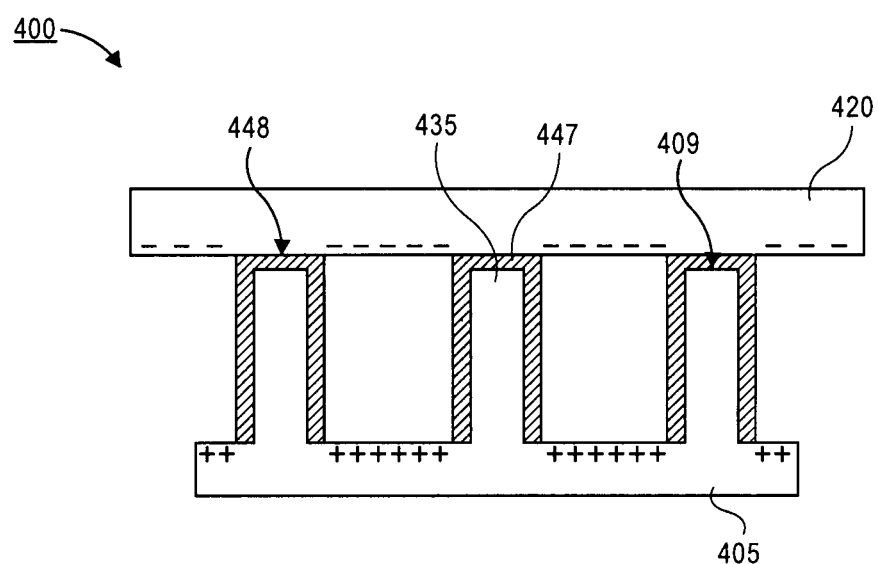
FIG. 4B is a cross-sectional illustration of a portion of an electrostatic chuck with a substrate secured to the protrusions, in accordance with an embodiment.

For example, FIG. 4B provides a cross-sectional illustration of a tool 400 with a substrate 420 secured to the electrostatic chuck 405. As shown, the electrostatic charge is primarily located along the surface of the electrostatic chuck 405 between the protrusions 435. The conductive layer 447 spreads the charge away from the support surface 409 that interfaces with the surface 448 of the substrate 420. Accordingly, at the location of direct contact between the substrate 420 and the electrostatic chuck 405, the electrostatic force is decreased in order to prevent damage to the backside of the substrate 420.

Figure 5:
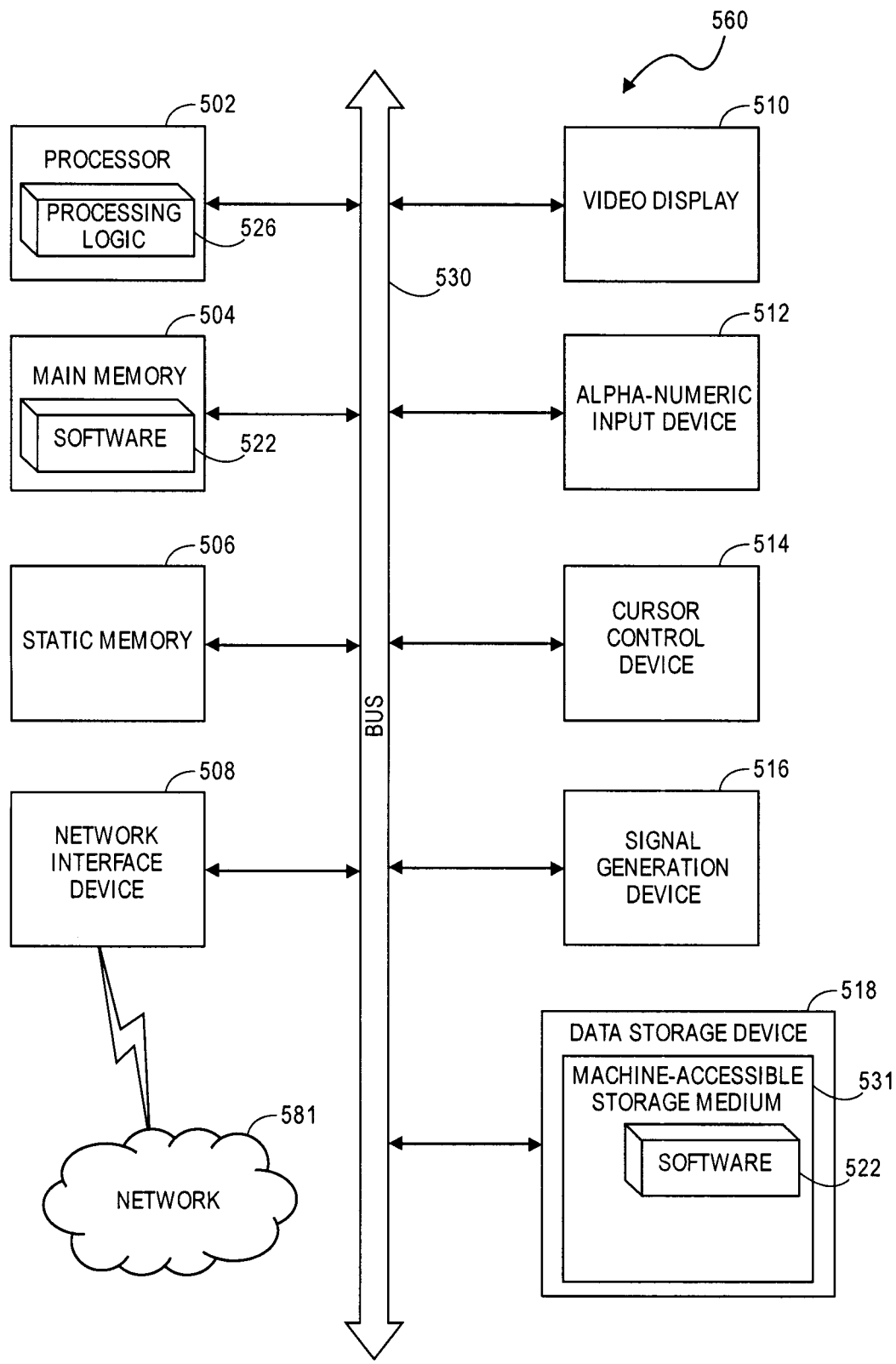
FIG. 5 illustrates a block diagram of an exemplary computer system that may be used in conjunction with processes that include using an electrostatic chuck with a non-planar support surface, in accordance with an embodiment.

Referring now to FIG. 5, a block diagram of an exemplary computer system 560 of a processing tool is illustrated in accordance with an embodiment. In an embodiment, the computer system 560 may be used to control the processing tool, such as processing tools 200 and 300 described above. In an embodiment, computer system 560 is coupled to and controls processing in the processing tool. Computer system 560 may be connected (e.g., networked) to other machines in a network 561 (e.g., a Local Area Network (LAN), an intranet, an extranet, or the Internet). Computer system 560 may operate in the capacity of a server or a client machine in a client-server network environment, or as a peer machine in a peer-to-peer (or distributed) network environment. Computer system 560 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 560, the term "machine" shall also be taken to include any collection of machines (e.g., computers) that individually or jointly execute a set (or multiple sets) of instructions to perform any one or more of the methodologies described herein.

Computer system 560 may include a computer program product, or software 522, having a non-transitory machine-readable medium having stored thereon instructions, which may be used to program computer system 560 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 560 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 560 may further include a system network interface device 508 for communicating with other devices or machines. The computer system 560 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium 531 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 560, the main memory 504 and the system processor 502 also constituting machine-readable storage media. The software 522 may further be transmitted or received over a network 561 via the system network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An electrostatic chuck, comprising:
    a chuck body;
    a support surface on the chuck body for supporting a substrate, wherein the support surface is non-planar, wherein the support surface comprises a plurality of protrusions, and wherein the plurality of protrusions comprise a plurality of concentric rings; and
    a conductive mesh embedded in the chuck body.

2. The electrostatic chuck of claim 1, wherein heights of the protrusions are non-uniform.

3. The electrostatic chuck of claim 2, wherein protrusions proximate to a center of the electrostatic chuck have a height that is less than a height of protrusions that are proximate to an edge of the electrostatic chuck.

4. The electrostatic chuck of claim 2, wherein protrusions proximate to a center of the electrostatic chuck have a height that is greater than a height of protrusions that are proximate to an edge of the electrostatic chuck.

5. The electrostatic chuck of claim 2, wherein a maximum difference between heights of the protrusions is 100 microns or greater.

6. The electrostatic chuck of claim 2, wherein a maximum difference between heights of the protrusions is 200 microns or greater.

7. The electrostatic chuck of claim 1, wherein the electrostatic chuck is a heater.

8. An electrostatic chuck, comprising:
a chuck body;
a support surface on the chuck body for supporting a substrate, wherein the support surface is non-planar, wherein the support surface comprises a plurality of protrusions wherein the plurality of protrusions comprise a plurality of pillars, wherein the plurality of pillars is arranged in concentric circles; and
a conductive mesh embedded in the chuck body.

9. The electrostatic chuck of claim 8, wherein the pillars are cylindrical pillars.

10. The electrostatic chuck of claim 8, wherein the plurality of pillars are each covered by a conductive layer.

11. A semiconductor manufacturing tool, comprising:
a heater pedestal;
a conductive mesh embedded in the heater pedestal, wherein the conductive mesh is electrically coupled to a voltage source; and
a support surface on the heater pedestal, the support surface being non-planar.

12. The semiconductor manufacturing tool of claim 11, wherein the support surface is concave.

13. The semiconductor manufacturing tool of claim 11, wherein the support surface is convex.

14. The semiconductor manufacturing tool of claim 11, wherein the support surface comprises a plurality of protrusions having non-uniform heights.

15. A heater pedestal, comprising:
a heater pedestal body;
a conductive mesh embedded in the heater pedestal body, wherein the conductive mesh is electrically coupled to a voltage source; and
a support surface on the heater pedestal body, wherein the support surface comprises a plurality of pillars extending out from the heater pedestal body and arranged in concentric rings, wherein pillars in an outermost concentric ring have a height that is greater than a height of pillars in an innermost concentric ring.

16. The heater pedestal of claim 15, wherein the support surface and the sidewalls of the pillars are covered by a conductive layer.

17. The heater pedestal of claim 15, wherein a difference between heights of the protrusions in the outermost concentric ring and the heights of the protrusions in the innermost concentric ring is 200 microns or greater.

* * * * *